United States Patent
Wu et al.

(10) Patent No.: US 9,274,164 B2
(45) Date of Patent: Mar. 1, 2016

(54) DETECTION APPARATUS FOR LIGHT-EMITTING DIODE CHIPS HAVING A LIGHT SENSING DEVICE RECEIVING LIGHT BEAMS PENETRATED THROUGH A TRANSPARENT CHUCK

(71) Applicant: GENESIS PHOTONICS INC, Tainan (TW)

(72) Inventors: Tai-Wei Wu, Tainan (TW); Tai-Cheng Tsai, Tainan (TW); Gwo-Jiun Sheu, Tainan (TW); Shou-Wen Hsu, Tainan (TW); Yun-Li Li, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 530 days.

(21) Appl. No.: 13/836,762

(22) Filed: Mar. 15, 2013

(65) Prior Publication Data
US 2014/0084931 A1 Mar. 27, 2014

(30) Foreign Application Priority Data

Sep. 27, 2012 (TW) .............................. 101135666 A (51) Int. Cl.
| | |
|---|---|
| *G01R 1/073* | (2006.01) |
| *G01R 31/26* | (2014.01) |
| *G01R 31/44* | (2006.01) |
| *G01R 1/04* | (2006.01) |
| *G02B 3/00* | (2006.01) |
| *G01J 1/04* | (2006.01) |
| *G01J 1/42* | (2006.01) |
| *H01L 33/00* | (2010.01) |

(52) U.S. Cl.
CPC ........... *G01R 31/2635* (2013.01); *G01J 1/0411* (2013.01); *G01R 1/04* (2013.01); *G01R 1/073* (2013.01); *G01R 31/44* (2013.01); *G02B 3/00* (2013.01); *G01J 2001/4247* (2013.01); *H01L 33/00* (2013.01)

(58) Field of Classification Search
CPC ..... G01R 1/073; G01R 31/2635; G01R 31/44
USPC .................. 250/205, 214 R, 214.1, 239, 216; 356/326, 432; 257/693, 632, 98, 89, 257/13; 324/414, 501, 762.01–762.07
See application file for complete search history.

(56) References Cited

U.S. PATENT DOCUMENTS 6,403,984 B1 * 6/2002 Kruangam ............ H01L 25/167
257/458

* cited by examiner

*Primary Examiner* — Que T Le
(74) *Attorney, Agent, or Firm* — Muncy, Geissler, Olds & Lowe, P.C.

(57) ABSTRACT

A detection apparatus for light-emitting diode chips comprises a transparent chuck with the light-concentration capability, a probing device and a light-sensing device. The transparent chuck comprises a light-incident plane and a light-emitting plane. The light-incident plane is used to bear a plurality of light-emitting diode chips under detection. The probing device comprises two probe pins and a power supply. The two ends of each probe pin is electrically connected to one of the light-emitting diode chips and the power supply, respectively, to make the light-emitting diode chip emit a plurality of light beams. The light beams penetrate through the transparent chuck by emitting into the incident plane of the transparent chuck. The light-sensing device is disposed on one side of the light-emitting plane of the transparent chuck to receive the light beams which penetrate through the transparent chuck.

11 Claims, 8 Drawing Sheets

DETECTION APPARATUS FOR LIGHT-EMITTING DIODE CHIPS HAVING A LIGHT SENSING DEVICE RECEIVING LIGHT BEAMS PENETRATED THROUGH A TRANSPARENT CHUCK

CROSS-REFERENCE TO RELATED APPLICATION

This application claims priority from Taiwan Patent Application No. 101135666, filed on Sep. 27, 2012, the contents of which are hereby incorporated by reference in their entirety for all purposes.

BACKGROUND OF THE INVENTION

1. Field of the Invention

The present invention relates to a detection apparatus, and particularly, a detection apparatus for detecting the light-emitting diode chips.

2. Description of the Related Art

Due to the technology improvements and the elevation of life quality, modern people pay more and more attention to illumination. From the ancient illumination measures of burning material, such as fire torches, oil lamps, candles, and kerosene lamps, using electricity, such as incandescent lamps and fluorescent lamps, to the light-emitting diode (LED), it all shows that illumination plays an important role in people's ordinary life.

Due to the combination of electrons and holes, light-emitting diode emits light to provide illumination or alerting. Compared with the traditional light sources, light-emitting diode has the advantages of high light-emitting efficiency, long service life, robust, fast response time, etc. In recent years thanks to the great promotion of governments and the increasing scale of the light-emitting diode street lamps in cities, using light-emitting diode as the illumination source is available everywhere.

Normally, a probe detector is used to detect the light-emitting efficiency of a light-emitting diode chip. A probe detector provides an electric voltage as the light-emitting power source of a light-emitting diode chip through probe pins. The light emitted by the light-emitting diode chip penetrates through the chuck which supports the light-emitting diode chip and is gathered by the light-sensing device of the probe detector to determine the light-emitting efficiency of the light-emitting diode chip. However, the limited detection range of the light-sensing device to the light emitted by a light-emitting diode chip can influence the accuracy of detecting the light-emitting efficiency of the light-emitting diode chip.

SUMMARY OF THE INVENTION

Based on the problems of the previous arts, one of the objects of the present invention is to provide a detection apparatus for light-emitting diode chips to solve the inefficient light-absorption problem of the light-sensing device.

According to another object of the present invention, the present invention provides a detection apparatus for light-emitting diode chips to concentrate the light emitted by light-emitting diode chips.

According to another object of this invention, the present invention provides a detection apparatus for light-emitting diode chips to accurately detect the light-emitting efficiency of light-emitting diode chips.

To fulfill the aforementioned objects, the present invention provides a detection apparatus for light-emitting diode chips, which comprises a transparent chuck with the light-concentration capability, a probing device, and a light-sensing device. The transparent chuck comprises a light-incident plane and a light-emitting plane, where the light-incident plane is used to bear a plurality of light-emitting diode chips under detection. The probing device comprises two probe pins and a power supply, wherein the two ends of each probe pin are electrically connected to one of the light-emitting diode chips and the power supply, respectively, to enable the light-emitting diode chip to emit a plurality of light beams. The light beams emit into the light-incident plane. The light-sensing device is disposed on one side of the light-emitting plane of the transparent chuck to receive the plurality of light beams which penetrate through the transparent chuck. The light-sensing device can be for example an integral sphere, a solar panel, a phototransistor, or a light dependent resistance (LDR).

According to the first aspect of the present invention, the area of the light-emitting plane of the transparent chuck is smaller than that of the light-incident plane.

According to the second aspect of the present invention, the light-emitting plane of the transparent chuck comprises a plurality of micro-structures which are prisms. Each prism comprises a first inclined surface and a second inclined surface, and the first inclined surface and the second inclined surface jointly form a vertex angle.

According to the third aspect of the present invention, the light-emitting plane of the transparent chuck comprises a plurality of micro-structures, wherein each micro-structure comprises a curved surface.

According to the fourth aspect of the present invention, the cross section of the light-emitting plane of the transparent chuck is an outward curved convex.

According to the fifth aspect of the present invention, the internal of the transparent chuck comprises a storage space in which a convergent lens is installed such that the transparent chuck can concentrate light.

According to the sixth aspect of the present invention, the internal of the transparent chuck comprises a storage space in which a light guide device is installed to guide the plurality of light beams which emitted into the transparent chuck. The light guide device is a light guide pillar or a light guide panel.

According to the seventh aspect of the present invention, the internal of the transparent chuck comprises a storage space in which a light guide device is installed to guide the plurality of light beams which emitted into the transparent chuck. The light guide device is an optical fiber.

As above-mentioned, the detection apparatus for light-emitting diode chips of the present invention may have one or more characteristics and advantages as described below:

(1) In the detection apparatus for light-emitting diode chips of the present invention, the light-gathering inefficiency of the light-sensing device is solved by using the transparent chuck with the light-concentration capability to gather the plurality of light beams emitted by light emitting diode chips.

(2) In the detection apparatus for light-emitting diode chips of the present invention, the purpose of accurately detecting the light-emitting efficiency of LED chips is achieved by using the transparent chuck with the light-concentration capability to gather the plurality of light beams emitted by LED chips.

DETAILED DESCRIPTION OF THE PREFERRED EMBODIMENTS

Figure 1:
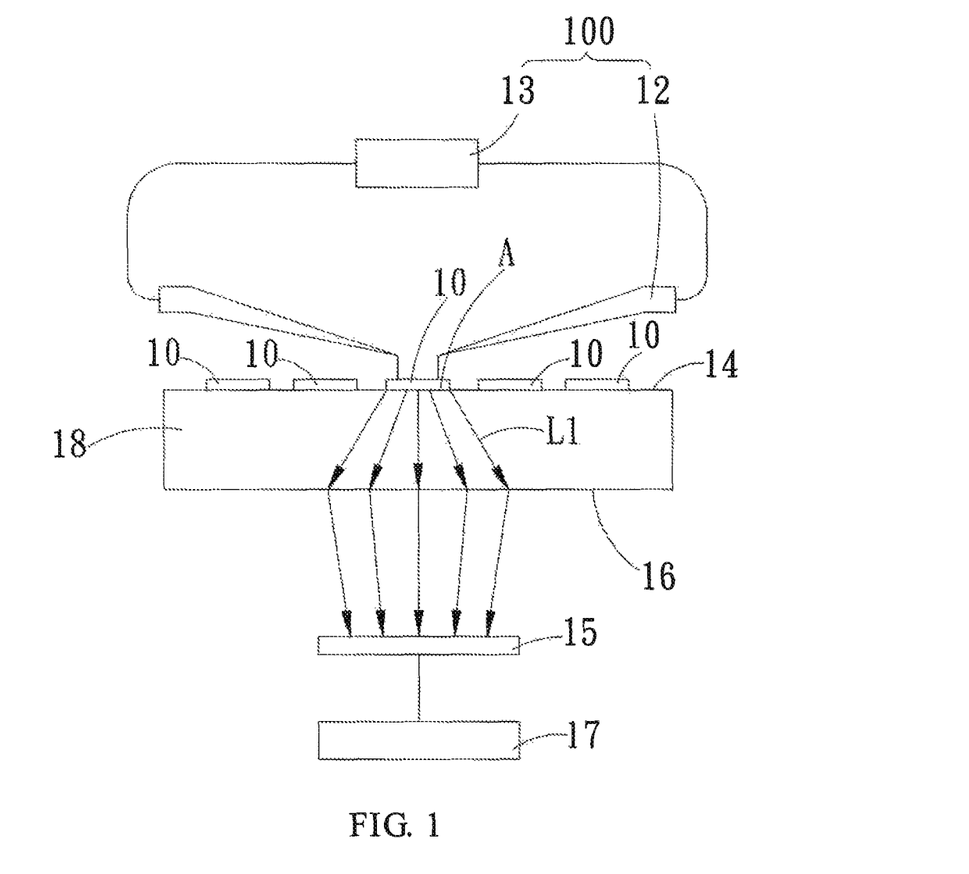
FIG. 1 is a sectional view showing the detection apparatus for light-emitting diode chips according to the preferred embodiment of the present invention.

Referring to FIG. 1, it is a sectional view showing the detection apparatus for light-emitting diode chips according to the preferred embodiment of the present invention. As shown in FIG. 1, the present invention of the detection apparatus for light-emitting diode chips comprises of a transparent chuck 18 with the light-concentrating capability, a probing device 100, and a light-sensing device 15. The transparent chuck 18 comprises a light-incident plane 14 and a light-emitting plane 16, where the light-incident plane 14 is used to support a plurality of light-emitting diode chips 10 under detection. The probing device 100 comprises two probe pins 12 and a power supply 13, the two ends of each probe pin 12 are electrically connected to one of the light-emitting diode chips A and the power supply 13, respectively. The power supply 13 provides an electrical voltage to the light-emitting diode chip A through the probe pin 12 to enable the light-emitting diode chip A to emit a plurality of light beams L1. The plurality of light beams L1 emitted into the light-incident plane 14 of the transparent chuck 18. The light-sensing device 15 is disposed on one side of the light-emitting plane 16 of the transparent chuck 18 to receive the plurality of light beams L1 which penetrate through the transparent chuck 18. The light-sensing device 15 can be for example an integral sphere, a solar panel, a phototransistor, or a light dependent resistance (LDR).

As shown in FIG. 1, the present invention of the detection apparatus for light-emitting diode chips is suitable for detecting the light-emitting efficiency of the light-emitting diode chips 10, the detection procedures are as follows: the power supply 13 of the probing device 100 provide an electric voltage to the light-emitting diode chip A through the probe pin 12 to enable the light-emitting diode chip A to emit the plurality of light beams L1; the plurality of light beams L1 emitted into the light-incident plane 14 of the transparent chuck 18; the transparent chuck 18 concentrate the plurality of light beams L1 emitted into the transparent chuck 18; and the light-sensing device 15 disposed on one side of the light-emitting plane 16 of the transparent chuck 18 receives the plurality of light beams L1 which penetrate through the transparent chuck 18, then the electronic device 17, which is electrically connected to the light-sensing device 15, presents the light-emitting efficiency of the light emitting diode chip A.

Since the goal of the present invention is to utilize a transparent chuck to concentrate the plurality of light beams emitted by the light-emitting diode chips, only a few aspects of the transparent chucks are enlisted to further explain the forms of the transparent chuck in the present invention. It will be understand that the present invention is not limited to the aspects thereof. Referring to FIG. 2 to FIG. 7, there are the sectional views of the first to the sixth aspects of the transparent chuck in the present invention. However, all such variations and equivalent modifications are also embraced within the scope of the invention as defined in the appended claims.

Figure 2:
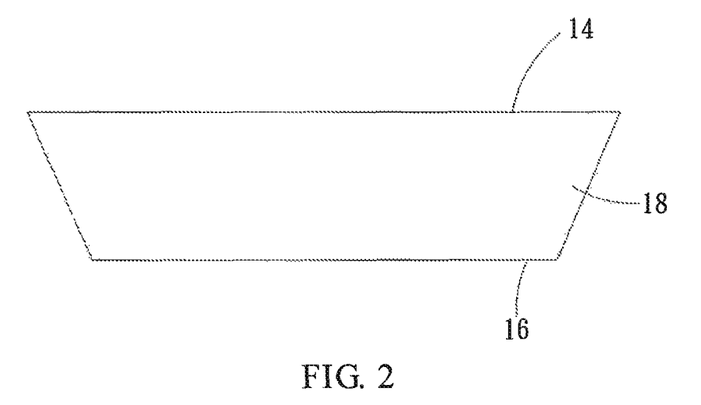
FIG. 2 is a sectional view of the first aspect showing the transparent chuck according to the preferred embodiment of the present invention.

Referring to FIG. 2, it is a sectional view of the first aspect showing the transparent chuck according to the preferred embodiment of the present invention, As shown in FIG. 2, the transparent chuck 18 comprises a light-incident plane 14 and a light-emitting plane 16, and the area of the light-emitting plane 16 of the transparent chuck is smaller than that of the light-incident plane 14 to achieve the goal of concentrating the plurality of light beams emitted by the light-emitting diode chips which are born by the light-incident plane 14.

Figure 3:
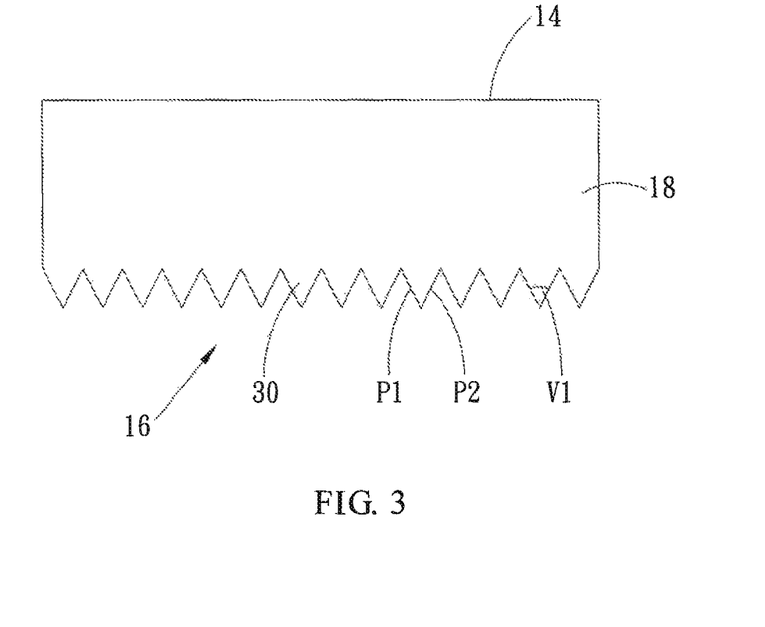
FIG. 3 is a sectional view of the second aspect showing the transparent chuck according to the preferred embodiment of the present invention.

Referring to FIG. 3, it is a sectional view of the second aspect showing the transparent chuck according to the preferred embodiment of the present invention. As shown in FIG. 3, the light-emitting plane 16 of the transparent chuck 18 comprises a plurality of micro-structures and for example, prisms 30. These prisms 30 comprise a first inclined surface P1 and a second inclined surface P2, the first inclined surface P1 and the second inclined surface P2 jointly form a vertex angle V1. Since the purpose of the prisms 30 is to concentrate the light emitted into the transparent chuck 18, any degree of vertex angle V1 which enables the prisms 30 to concentrate light belongs to the protection scope of the present invention.

Figure 4:
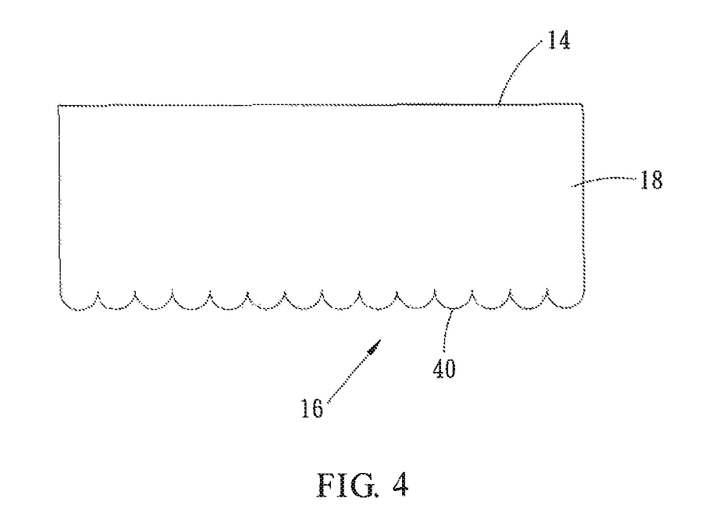
FIG. 4 is a sectional view of the third aspect showing the transparent chuck according to the preferred embodiment of the present invention.

Referring to FIG. 4, it is a sectional view of the third aspect showing the transparent chuck according to the preferred embodiment of the present invention. As shown in FIG. 4, the light-emitting plane 16 of the transparent chuck 18 comprises a plurality of micro-structures, where each micro-structure comprises a curved surface 40. The purpose of the curved surfaces 40 of the micro-structures is to concentrate the light emitted into the transparent chuck 18, and any curved surface 40 which has the function of concentrating light belongs to the protection scope of the present invention.

In the second and third aspects of the transparent chuck in the preferred embodiment of the present invention, the surface of the transparent chuck can be processed to form the micro-structures. The processing, for example the coating process, the dot printing, the etching process, laser, and the chemical vapor deposition (CVD), are implemented on the light-emitting plane of the transparent chuck to form a regular or irregular coarsening surface. Besides, the material of the micro-structures can be for example polystyrene, silicon dioxide, poly acrylic, silicon oxide, silicon nitride, silicon oxynitride, or fluorinated carbon.

Figure 5A:
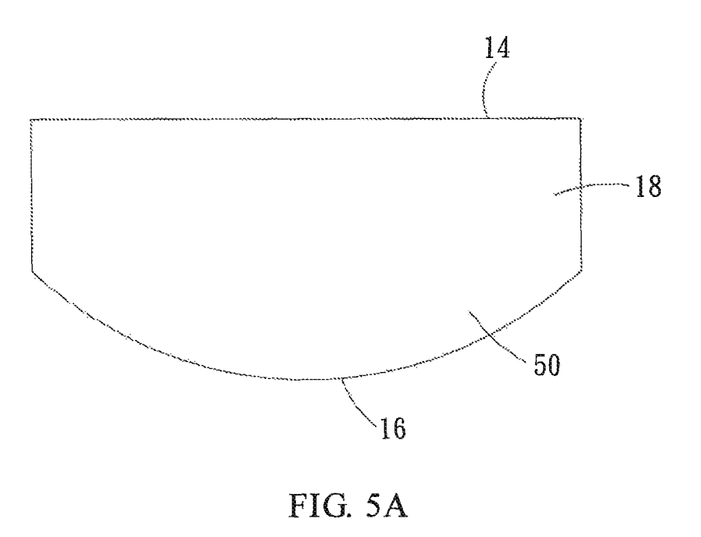
FIG. 5A is a sectional view of the fourth aspect showing the transparent chuck according to the preferred embodiment of the present invention.
Figure 5B:
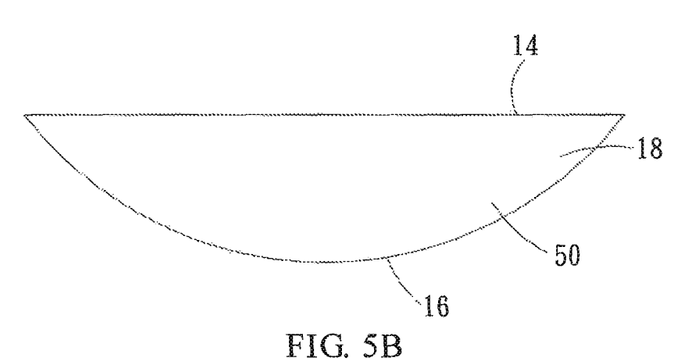
FIG. 5B is a sectional view of the fourth aspect showing the transparent chuck according to the preferred embodiment of the present invention.

Referring to FIG. 5A and 5B, they are the sectional views of the fourth aspect showing the transparent chuck according to the preferred embodiment of the present invention. As shown in FIG. 5A and 5B, the cross-section surface of the light-emitting plane 16 of the transparent chuck 18 in the fourth aspect is an outward curved convex 50. In another word, the light-incident plane 14 and the light-emitting plane 16 of the transparent chuck 18 can be connected (as shown in FIG. 5B) or disconnected (as shown in FIG. 5A). Thus, any combination of the light-incident plane 14 and the light-emitting plane 16 which has the function of concentrating light belongs to the protection scope of the present invention.

Figure 6:
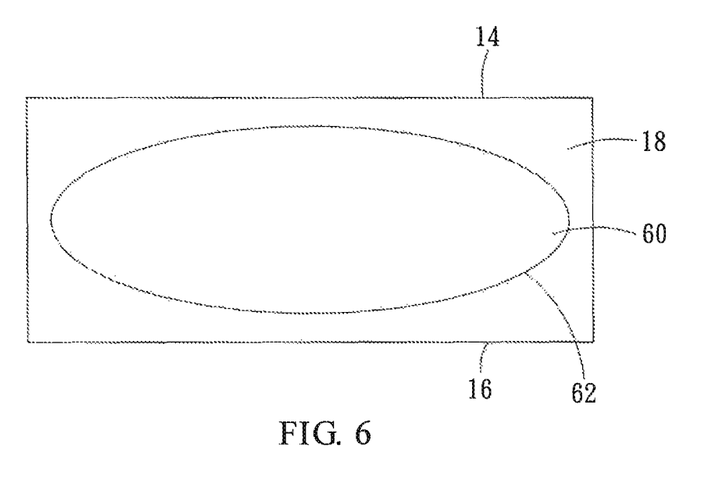
FIG. 6 is a sectional view of the fifth aspect showing the transparent chuck according to the preferred embodiment of the present invention.

Referring to FIG. 6, it is a sectional view of the fifth aspect showing the transparent chuck according to the preferred embodiment of the present invention. As shown in FIG. 6, the internal of the transparent chuck 18 comprises a storage space 62 in Which a convergent lens 60 is installed to enable the transparent chuck 18 to concentrate the plurality of light beams which emitted into the transparent chuck 18.

Figure 7:
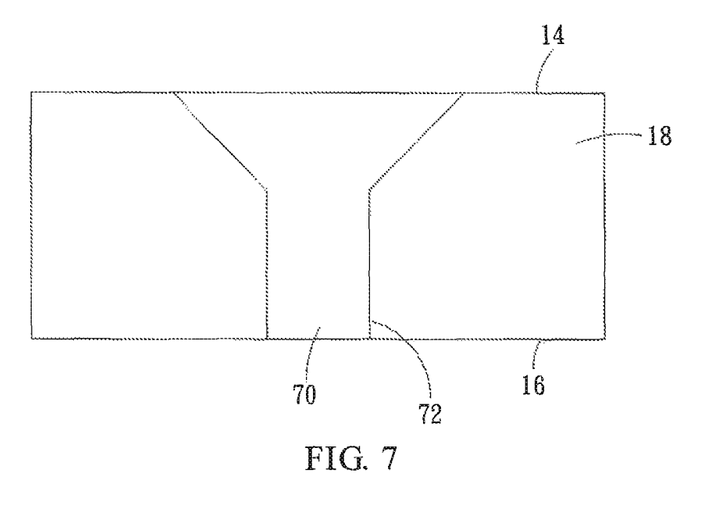
FIG. 7 is a sectional view of the sixth aspect showing the transparent chuck according to the preferred embodiment of the present invention.

Referring to FIG. 7, it is a sectional view of the sixth aspect showing the transparent chuck according to the preferred embodiment of the present invention. As shown in FIG. 7, the internal of the transparent chuck 18 comprises a storage space 72 in which a light guide device is installed to guide the plurality of light beams which emitted into the transparent chuck 18. The light guide device can be for example a light guide pillar or a light guide panel, and the light guide device in FIG. 7 is a light guide pillar 70. However, the light guide device of the present invention is not confined to the light guide pillar 70 in FIG. 7. In another word, any light guide device which has the light-guiding function belongs to the protection scope of the present invention. For example, the light guide device in the sixth aspect of the present invention can also be an optical fiber. Moreover, after the disclosure of the present invention, a person skilled in this art should understand the variety and sizes of the light guide devices with the light guiding function.

In summary, the detection apparatus for light-emitting diode chips of the present invention is to utilize a transparent chuck to concentrate the light emitted by the light-emitting diode chips such that the light collection efficiency of the light-sensing device can be increased. In this way, the detection accuracy of light emitting efficiency of the light emitted diodes can be increased.

In summation, although the present invention has been described with reference to the foregoing preferred embodiment, it will be understood that the invention is not limited to the details thereof. Various equivalent variations and modifications may still occur to those skilled in this art in view of the teachings of the present invention. Thus, all such variations and equivalent modifications are also embraced within the scope of the invention as defined in the appended claims.

What is claimed is:

1. A detection apparatus for light-emitting diode chips, the detection apparatus at least comprising:
   a transparent chuck with the light-concentration capability, the transparent chuck comprising a light-incident plane and a light-emitting plane, where the light-incident plane is used to bear a plurality of light-emitting diode chips under detection;
   a probing device, comprising two probe pins and a power supply, the two ends of each probe pin being electrically connected respectively to one of the light-emitting diode chips and the power supply to enable the light-emitting diode chip to emit a plurality of light beams which are emitted into the light-incident plane; and
   a light-sensing device, disposed on one side of the light-emitting plane of the transparent chuck to receive the light beams which penetrate through the transparent chuck.

2. The detection apparatus for light-emitting diode chips of claim 1, wherein the area of the light-emitting plane of the transparent chuck is smaller than that of the light-incident plane.

3. The detection apparatus for light-emitting diode chips of claim 1, wherein the light-emitting plane of the transparent chuck comprises a plurality of micro-structures.

4. The detection apparatus for light-emitting diode chips of claim 3, wherein the micro-structures are prisms having a first inclined surface and a second inclined surface, and the first inclined surface and the second inclined surface jointly form a vertex angle.

5. The detection apparatus for light-emitting diode chips of claim 3, wherein each of the micro-structures has a curved surface.

6. The detection apparatus for light-emitting diode chips of claim 1, wherein the cross section of the light-emitting plane of the transparent chuck is an outward curved convex.

7. The detection apparatus for light-emitting diode chips of claim 1, wherein the internal of the transparent chuck comprises a storage space in which a convergent lens is installed to provide the transparent chuck with the light-concentration function.

8. The detection apparatus for light-emitting diode chips of claim 1, wherein the internal of the transparent chuck comprises a storage space in which a light guide device is installed to guide the light beams which are emitted into the transparent chuck.

9. The detection apparatus for light-emitting diode chips of claim 8, wherein the light guide device is an optical fiber.

10. The detection apparatus for light-emitting diode chips of claim 8, wherein the light guide device is a light guide pillar or a light guide panel.

11. The detection apparatus for light-emitting diode chips of claim 1, wherein the light-sensing device is an integral sphere, a solar panel, a phototransistor, or a light dependent resistance (LDR).

\* \* \* \* \*